United States Patent [19]

Onaya

[11] Patent Number: 5,594,440
[45] Date of Patent: Jan. 14, 1997

[54] A/D CONVERTER HAVING A VARIABLE INTEGRATOR WHOSE TIME CONSTANT CAN BE CHANGED

[75] Inventor: Masato Onaya, Gunma-ken, Japan

[73] Assignee: Sanyo Electric Co., Ltd., Osaka, Japan

[21] Appl. No.: 278,174

[22] Filed: Jul. 20, 1994

[30] Foreign Application Priority Data

Jul. 21, 1993 [JP] Japan ................................. 5-179514

[51] Int. Cl.⁶ ..................................... H03M 1/12
[52] U.S. Cl. ................... 341/131; 341/143; 341/166
[58] Field of Search .................... 341/166, 118, 341/120, 131, 138, 143

[56] References Cited

U.S. PATENT DOCUMENTS 4,123,709  10/1978  Dodds et a. ........................ 325/38 B

FOREIGN PATENT DOCUMENTS 0308826  3/1989  European Pat. Off. .
61-050424  3/1986  Japan .

OTHER PUBLICATIONS

H. R. Schindler, "Delta Modulation Coding", IBM Technical Disclosure Bulletin, vol. 13, No. 3, Nov. 1970, pp. 1564–1565.

European Search Report, dated Oct. 25, 1994, application No. 94205404.9.

Tsutomu Ishikawa, et al., "*One–Bit A/D D/A Converters IC for Audio Delay*", IEEETransactions on Consumer Electronics, vol. 35, No. 4, Nov. 1989.

D. L. Agostini, et al., "*Delta Modulator*", IBM Technical Disclosure Bulletin, vol. 19, No. 2 Jul. 1976, pp. 447–448.

*Primary Examiner*—Todd DeBoer
*Attorney, Agent, or Firm*—Loeb & Loeb LLP

[57] ABSTRACT

Pulse signals indicating up or down of a time constant are received and counted. When a time-out occurs, a time constant change signal is output. At up counting, when input signal is low, the flip-flop 80 of each bit is forcibly set to 1. Then, an up counter consisting of the high-order two bits (control bits) is provided. A time constant of a variable integrator is changed in response to output of the high-order two bits, so that the time constant can be changed rapidly. On the other hand, if the input signal is high, a 5-bit down counter is provided. Thus, the time constant of the variable integrator can be changed gently.

16 Claims, 12 Drawing Sheets

| S1 | S2 | S3 | S4 | OUT-PUT 1 | OUT-PUT 2 |
|---|---|---|---|---|---|
| 0 | 0 | 0 | 0 | L | L |
| 1 | 0 | 0 | 0 | L | L |
| 0 | 1 | 0 | 0 | L | L |
| 1 | 1 | 0 | 0 | L | L |
| 0 | 0 | 1 | 0 | H | L |
| 1 | 0 | 1 | 0 | H | L |
| 0 | 1 | 1 | 0 | H | H |
| 1 | 1 | 1 | 0 | H | H |
| 0 | 0 | 0 | 1 | H | H |
| 1 | 0 | 0 | 1 | H | H |
| 0 | 1 | 0 | 1 | H | L |
| 1 | 1 | 0 | 1 | H | L |
| 0 | 0 | 1 | 1 | L | L |
| 1 | 0 | 1 | 1 | L | L |
| 0 | 1 | 1 | 1 | L | L |
| 1 | 1 | 1 | 1 | L | L |

Fig. 7

| UP COUNT | | | | | DOWN COUNT | | | | |
|---|---|---|---|---|---|---|---|---|---|
| Q1 | Q2 | Q3 | Q4 | Q5 | Q1 | Q2 | Q3 | Q4 | Q5 |
| 1 | 1 | 1 | 0 | 0 | 1 | 1 | 1 | 1 | 1 |
| 1 | 1 | 1 | 1 | 0 | 0 | 1 | 1 | 1 | 1 |
| 1 | 1 | 1 | 0 | 1 | 1 | 0 | 1 | 1 | 1 |
| 1 | 1 | 1 | 1 | 1 | 0 | 0 | 1 | 1 | 1 |
| 1 | 1 | 1 | 0 | 0 | 1 | 1 | 0 | 1 | 1 |
| 1 | 1 | 1 | 1 | 0 | 0 | 1 | 0 | 1 | 1 |
| 1 | 1 | 1 | 0 | 1 | 1 | 0 | 0 | 1 | 1 |
| 1 | 1 | 1 | 1 | 1 | 0 | 0 | 0 | 1 | 0 |
| 1 | 1 | 1 | 0 | 0 | 1 | 1 | 1 | 0 | 1 |
| 1 | 1 | 1 | 1 | 0 | 0 | 1 | 1 | 0 | 1 |
| 1 | 1 | 1 | 0 | 1 | 1 | 0 | 1 | 0 | 1 |
| 1 | 1 | 1 | 1 | 1 | 0 | 0 | 1 | 0 | 1 |

Fig. 9

| UP COUNT | | | | DOWN COUNT | | | |
|---|---|---|---|---|---|---|---|
| Q1 | Q2 | Q3 | Q4 | Q1 | Q2 | Q3 | Q4 |
| 0 | 0 | 0 | 0 | 1 | 1 | 1 | 1 |
| 1 | 0 | 0 | 0 | 0 | 1 | 1 | 1 |
| 0 | 1 | 0 | 0 | 1 | 0 | 1 | 1 |
| 1 | 1 | 0 | 0 | 0 | 0 | 1 | 1 |
| 0 | 0 | 1 | 0 | 1 | 1 | 0 | 1 |
| 1 | 0 | 1 | 0 | 0 | 1 | 0 | 1 |
| 0 | 1 | 1 | 0 | 1 | 0 | 0 | 1 |
| 1 | 1 | 1 | 0 | 0 | 0 | 0 | 1 |
| 0 | 0 | 0 | 1 | 1 | 1 | 1 | 0 |
| 1 | 1 | 0 | 1 | 0 | 0 | 1 | 0 |
| 0 | 0 | 1 | 0 | 1 | 1 | 0 | 1 |
| 1 | 1 | 1 | 0 | 0 | 0 | 0 | 1 |
| 0 | 0 | 0 | 1 | 1 | 1 | 1 | 0 |
| 1 | 1 | 1 | 1 | 0 | 0 | 0 | 0 |
| 0 | 0 | 0 | 0 | 1 | 1 | 1 | 1 |
| 1 | 1 | 1 | 0 | 0 | 0 | 0 | 1 |

Fig. 12

A/D CONVERTER HAVING A VARIABLE INTEGRATOR WHOSE TIME CONSTANT CAN BE CHANGED

BACKGROUND OF THE INVENTION

1. Field of the Invention

This invention relates to an A/D converter for use with a delay circuit and more particularly to an A/D converter containing a variable integrator whose time constant is changed.

2. Description of the Prior Art

Hitherto, a surround sound of an audio machine has been produced by delaying a reproduced sound for a predetermined time, attenuating, and superposing the resulting sound. Such reproduction modes as a stadium mode and a church mode are available for delaying and superposing reproduced sounds by different techniques.

One of the delay circuits used for such purposes is shown in FIG. 1. In the circuit, an analog reproduction signal is temporarily converted into digital data by an A/D converter 10 and the digital data is stored in a memory 12. The data read from the memory 12 is converted back into analog data by a D/A converter 14. In the circuit, the write time into and read time out of the memory 12 are varied and the difference therebetween becomes a delay time.

Used as the A/D converter 10 is one as shown in FIG. 2. The A/D converter 10 comprises an adder 20, a quantizer 22, a variable integrator 24, and a control section 26; an analog output of the variable integrator 24 is fed back into the adder 20 to which an analog signal is input. The quantizer 22 comprises a comparator 22a which outputs high or low in response to input signal voltage and a latch circuit 22b which latches the output of the comparator 22a in response to a predetermined clock for converting an input signal into a 1-bit digital signal. The variable integrator 24 integrates outputs of the quantizer 22 for providing an analog signal corresponding to the input signal. The output of the variable integrator 24 is fed back into the adder 20, which then finds a difference between both the signals; for the input signal with no change, the quantizer 22 outputs high and low, namely, "1" and "0" alternately.

On the other hand, the control section 26 changes a time constant in the variable integrator 24 in response to the output state of the quantizer 22. That is, if the output level of the adder 20 is large and the quantizer 22 makes an unbalanced output between "0" and "1," the time constant of the variable integrator 24 is made small; if the output level of the adder 20 is small and the quantizer 22 outputs "0" and "1" keeping a balance therebetween, the time constant of the variable integrator 24 is made large. Under such control, when there is silence, the time constant can be made large to suppress occurrence of high-frequency noise; when the input signal changes, the time constant can be made small to output a high tone sufficiently.

In the D/A converter 14, the analog signal is restored in response to the signal read from the memory 12. At that time, the same variable integrator as the A/D converter 10 is used to provide the same analog signal as the input signal.

Thus, in the conventional circuit, the time constant of the variable integrator 24 is determined uniquely in response to the detected level. That is, the time constant is changed in the same degree for attack, in which sound becomes large rapidly, and for recovery, in which sound becomes small rapidly. If the signal subjected to such signal processing is reproduced, the listener feels a sense of acoustic disorder. If the time constant is set too large, high frequencies are cut too much in the beginning of attack; if the time constant is set too small, high frequencies are cut rapidly during recovery.

In the conventional device, the control width when the time constant is changed is always the same, and if the input signal changes rapidly and largely, it cannot be followed up and slant overload distortion on the waveform of reproduced sound becomes large.

SUMMARY OF THE INVENTION

It is therefore an object of the invention to provide an A/D converter having a variable integrator capable of preferred following-up both at attack and at recovery.

To this end, according to the Invention, there is provided an A/D converter having characteristics that can be changed, comprising a quantizer for quantizing an analog signal for outputting a pulse string signal, a variable integrator for integrating the output of the quantizer with any desired time constant, an adder for adding the input analog signal and an output of the variable integrator and supplying the result of the addition to the quantizer, change direction detection means for detecting a direction in which an input signal change becomes large or small, and time constant control means for controlling so that a time constant change speed accelerates, upon detection of the direction in which an input signal change becomes large, as compared with the direction in which an input signal change becomes small.

Thus, according to the invention, the change direction detection means detects the direction in which an input signal change becomes large or small. Control is performed so that a time constant change speed accelerates, upon detection of the direction in which an input signal change becomes large, as compared with the direction in which an input signal change becomes small. That is, when the input signal changes from the state with no change to the large change state, the time constant is changed promptly. In contrast, if the input signal changes from the large change state to the small change state, the time constant is changed gently. Thus, according to a delay circuit using the A/D converter of the invention, at attack, the time constant can be changed promptly for preventing a high tone from being cut and at recovery, a high tone can be cut gradually to reduce a sense of acoustic disorder.

The change direction detection means may comprise:

a counter for counting high or low duration of the pulse string signal output by the quantizer for a predetermined time; and decode means responsive to whether or not a value of the counter is a predetermined intermediate level for outputting a high or low signal, whereby a large or small change is detected in response to whether the decode means outputs high or low.

The time constant control means comprises:

an up/down counter which serves as an up or down counter in response to the direction in which a change becomes large or small, output by the change direction detection means, whereby the number of bits of the up/down counter is changed at up counting and at down counting, thereby providing a different signal depending on the direction in which a change becomes large or small, for changing the time constant with the signal.

The up/down counter may have at least one dummy bit and use the dummy bit for counting only either at up counting or at down counting for changing the number of bits.

The time constant control means may control so that the time constant change speed accelerates in sequence if the same change direction continues.

Thus, a response accelerates gradually at attack and at recovery. Therefore, when the same state continues, a response can be accelerated gradually and a sense of acoustic disorder can be decreased.

The time constant control means may comprise:

an up/down counter which serves as an up or down counter in response to the direction in which a change becomes large or small, output by the change direction detection means, whereby the number of bits of the up/down counter is changed in sequence both at up counting and at down counting and is increased in sequence at either up counting or down counting and is decreased in sequence at the other counting, thereby providing a signal which varies and changes in response speed in sequence depending on the direction in which a change becomes large or small, for changing the time constant with the signal.

The up/down counter may have at least two dummy bits and change the number of dummy bits used for counting at up counting and at down counting In sequence.

BRIEF DESCRIPTION OF THE DRAWINGS

In the accompanying drawings:

FIG. 7 is an illustration showing the count state of the counter 50 of the present invention;

FIG. 9 is an illustration showing the flip-flop state in the time constant controller of the present invention;

FIG. 12 is an illustration showing the flip-flop state in the time constant controller of an embodiment of the present invention.

DESCRIPTION OF THE PREFERRED EMBODIMENTS

Referring now to the accompanying drawings, there are shown preferred embodiments of the invention.

OVERALL CONFIGURATION OF CONTROL SECTION

Figure 1:
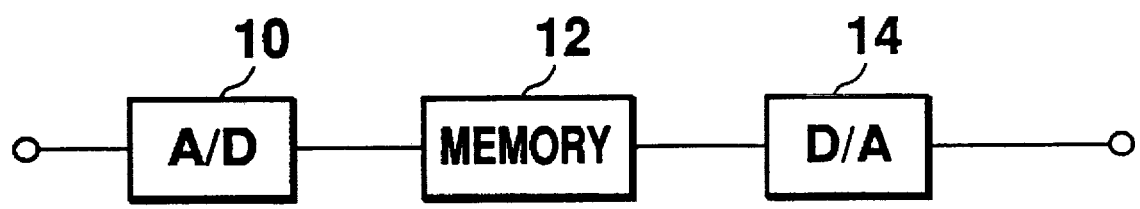
FIG. 1 is a block diagram showing the schematic configuration of a delay circuit of the prior art.
Figure 2:
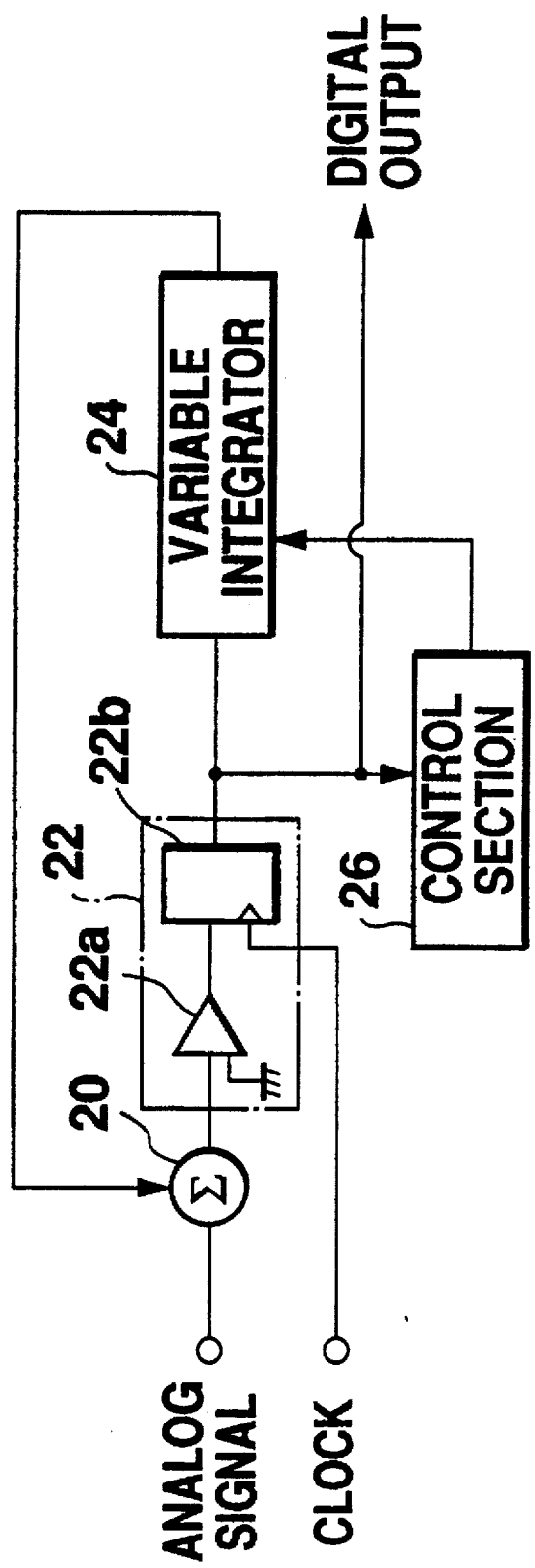
FIG. 2 is a block diagram showing a configuration example of an A/D converter of the prior art.
Figure 3:
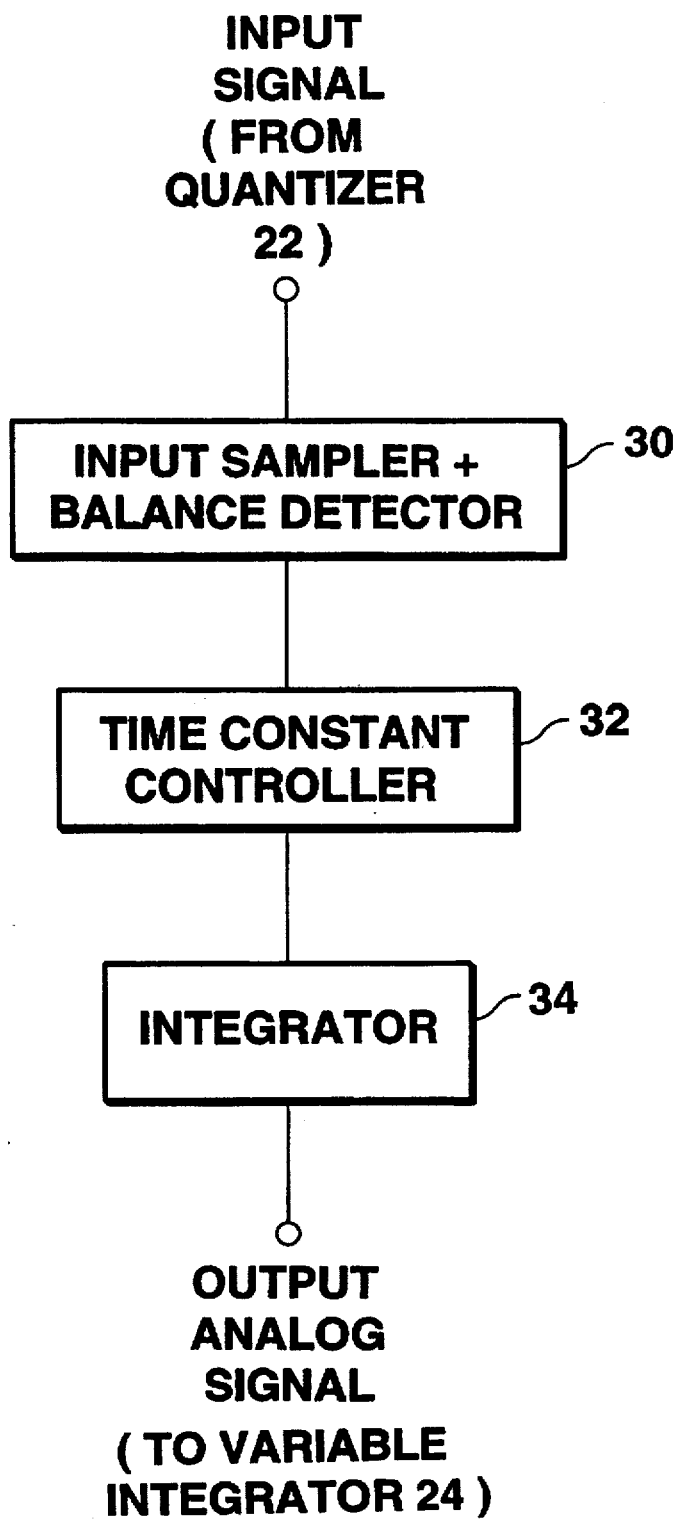
FIG. 3 is a block diagram showing the configuration of an entire control section of an embodiment of the present invention.

FIG. 3 is a block diagram showing the configuration of a control section of an A/D converter according to one embodiment of the invention. As shown in FIG. 3, the control section consists of a low-pass filter 30, a time constant controller 32, and an integrator 34, whereby the high-frequency component of an input signal, which is output by the quantizer 22 (see FIG. 2), is removed, then the level is detected.

CONFIGURATION INPUT SAMPLER AND BALANCE DETECTOR AND TIME CONSTANT CONTROLLER RECTIFIER

Figure 4:
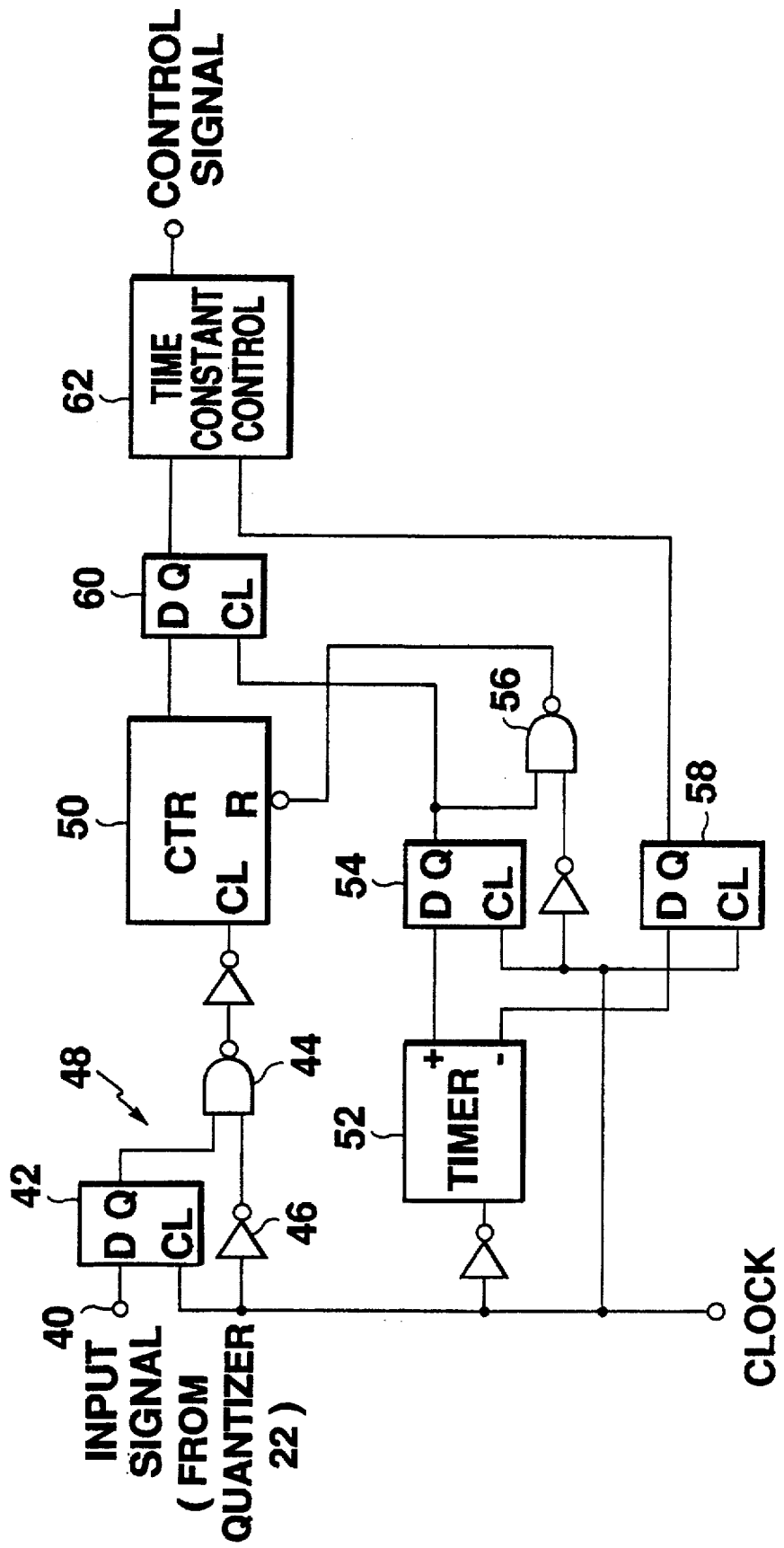
FIG. 4 is a block diagram showing the configuration of an input sampler and balance detector and a time constant controller in the control section of an embodiment of the present invention.

In the embodiment, the A/D converter is made of a digital circuit. FIG. 4 shows the configuration of the portion of the input sampler and balance detector 30 and the time constant controller 32. A pulse string signal output from the quantizer 22 is input through an input terminal 40 to a D input terminal of a D flip-flop 42. A predetermined clock is input to a CL input terminal of the D flip-flop 42. A Q output of the D flip-flop 42 is input to one input terminal of a NAND gate 44. The clock is input via an inverter 46 to the other input terminal of the NAND gate 44. The D flip-flop 42, the NAND gate 44, and the inverter 46 make up an input signal sampling circuit 48. An output of the NAND gate 44 is inverted, then input to a CL input terminal of a counter 50 for counting (high) outputs of the sampling circuit 48.

Also, the clock is input to a timer 52, which then counts the clock and when a predetermined time has elapsed, generates an output signal. The output signal of the timer 52 is input to a D input terminal of a D flip-flop 54, and the clock is supplied to a CL input terminal of the D flip-flop 54. Therefore, the output of the timer 52 is held in the D flip-flop 54. A Q output of the D flip-flop 54 is input to one input terminal of a NAND gate 56 and the inverted clock is input to the other input terminal of the NAND gate 56. An output of the NAND gate 56 is supplied to a reset terminal of the counter 50. Therefore, when the timer 52 times out, the counter 50 is reset. An output of the timer 52 is also supplied to a D input terminal of a D flip-flop 58 having a CL input terminal to which the clock is supplied. Thus, the output of the timer 52 is held in the D flip-flop 58.

On the other hand, an output of the counter 50 is supplied to a D input terminal of a D flip-flop 60 and a Q output of the D flip-flop 54 is supplied to a CL input terminal of the D flip-flop 60. Thus, when the timer 52 outputs the time-out output, the output of the counter 50 is latched in the D flip-flop 60. Q outputs of the D flip-flops 58 and 60 are supplied to a time constant controller 62.

Next, the operation of the circuit in FIG. 4 will be discussed. The pulse string input signal output from the quantizer 22 is applied to the input terminal 40 and is sampled by the sampling circuit 48 in response to the clock signal applied to the CL terminal. The clock signal is a signal having a sufficiently higher frequency than the input signal. On the other hand, the timer 52 counts the clock signal, and after counting a predetermined number of clock signals (when a predetermined time has elapsed), outputs high at a + output terminal and low at a − output terminal. The D flip-flop 54 outputs a signal which goes high for only one clock after the time-out; the D flip-flop 58 outputs a signal which goes low only for one clock after the time-out.

The counter 50 counts (high) output signals from the sampling circuit 48 for the predetermined time set in the timer 52. The D flip-flop 42 in the sampling circuit 48 takes in the input signal on the rising edge of a clock signal. When the clock signal is low and the D flip-flop 42 outputs high does, the NAND gate 44 supply high to the counter 50. Therefore, the count value corresponding to the time during which the input signal is high is set in the counter 50. That is, when the input signal contains a large high portion, the count value of the counter 50 increases; when the input signal contains a large low portion, the count value of the counter 50 decreases. Output of the NAND gate 56 is supplied to the reset terminal of the counter 50. When time-out output of the timer 52, which is high, is taken in the D flip-flop 54 and the clock signal goes low, the NAND gate 56 outputs high. Therefore, when the timer 52 times out, the counter 50 is reset.

Figure 5:
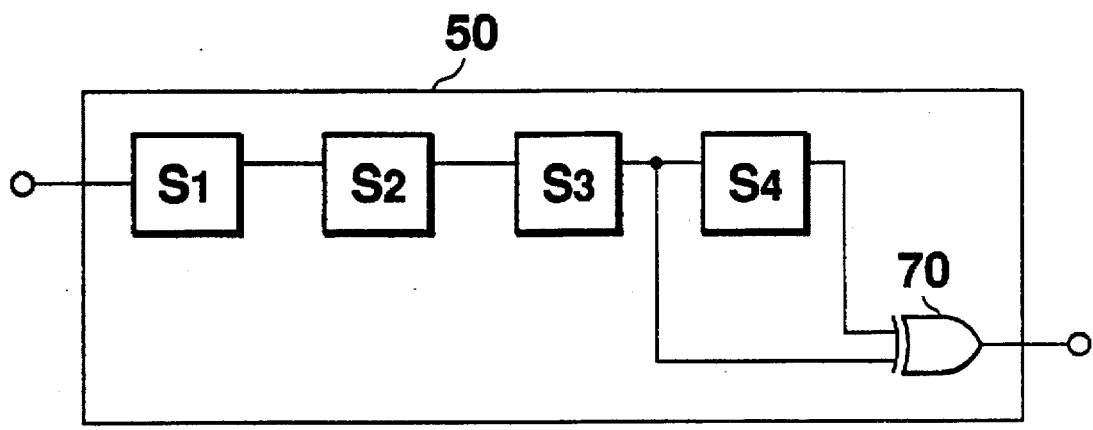
FIG. 5 is a block diagram showing a configuration example of a counter 50 of the present invention.
Figure 6:
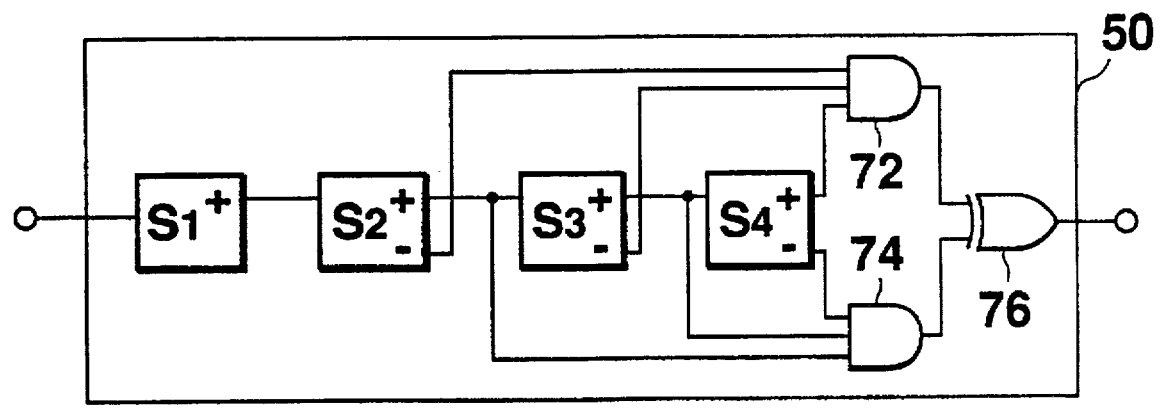
FIG. 6 is a block diagram showing another configuration example of the counter 50 of the present invention.

On the other hand, when the time-out output of the timer 52, which is high, is taken in the D flip-flop 54, the high output is supplied to the CL terminal of the D flip-flop 60, which then takes in output of the counter 50 and outputs it through the Q output terminal. The counter 50 is a 4-bit counter having a decoder to generate an output, for example, as shown in FIG. 5. In the example in FIG. 5, an exclusive-OR gate 70 having input terminals connected to the Q outputs at the third and fourth bits is provided as the decoder. FIG. 6 shows another example of the counter 50, wherein the decoder consists of a first AND gate 72 having input terminals connected to the inverted Q outputs at the second and third bits and the Q output at the fourth bit, a second AND gate 74 having input terminals connected to the Q outputs at the second and third bits and the inverted Q output at the fourth bit, and an exclusive-OR gate 76 to which outputs of the first and second AND gates 72 and 74 are applied.

In FIG. 5, when only either of the Q outputs at the third and fourth bits is high, the exclusive-OR gate 70 of the counter 50 generates an output high; otherwise, it generates an output low, as shown under Output 1 in FIG. 7. Thus, if the input signal applied to the input terminal 40 (output of the quantizer 22) is a signal containing unbalanced components between high and low, a low output Is generated; if the signal contains a substantially equal balance therebetween, a high output is generated. Therefore, when the input signal state changes, the counter 50 outputs low. In the example in FIG. 6, the counter 50 outputs as shown under Output 2 in FIG. 7. Thus, when the counter 50 in FIG. 6 is used, the high output range is narrower than that when the counter 50 in FIG. 5 is used.

The output of the counter 50 held by the D flip-flop 60 is applied to the time constant controller 62 as up or down data. That is, up data for reducing the time constant is supplied to the time constant controller 62 as low; down data for increasing the time constant is supplied as high. On the other hand, the output of the D flip-flop 58 is applied to the time constant controller 62 as a clock.

Figure 8:
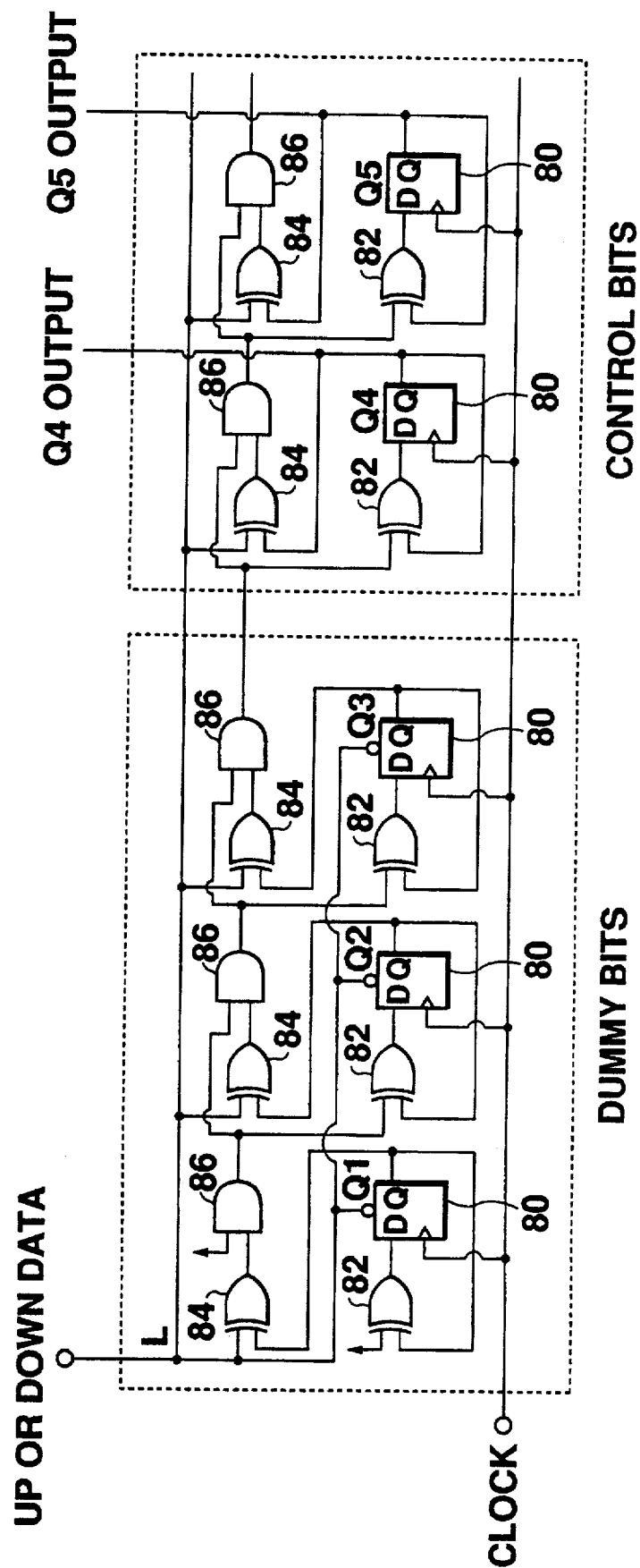
FIG. 8 is a block diagram showing the configuration of one example of a time constant controller of the present invention.

FIG. 8 shows a configuration example of the time constant controller 62. The time constant controller 62 forms a 5-bit counter (Q1–Q5). The low-order three bits provide dummy bits whose state is changed to the active or inactive state in response to a control signal. The high-order two bits provide control bits which are always active. An output signal of the time constant controller 62 is used to control the time constant of the variable integrator 24; specifically, it is used to control charging current and discharging current of capacitors. When the D flip-flop 60 outputs low, the function of the dummy bits is killed. At this time, only the control bits of the time constant controller 62 serve to count up. In contrast, when the D flip-flop 60 outputs high, the five bits containing the dummy bits serve to count down.

Each bit of the time constant controller 62 has a D flip-flop 80, an exclusive-OR gate 82 connected to a D input terminal of the D flip-flop 80, an exclusive-OR gate 84, and an AND gate 86. A Q output of the D flip-flop 80 is output via the exclusive-OR gate 84 and the AND gate 86. The Q output of the D flip-flop 80 is input to one input terminal of the exclusive-OR gate 82 and an output from the D flip-flop 60 is input to one input terminal of the exclusive-OR gate 84.

Other input terminals of the exclusive-OR gate 82 and the AND gate 86 of the least significant bit (LSB) are pulled high to a power supply. Bit output at the preceding stage, namely, output of the AND gate 86 of the preceding bit is input to other input terminals of the exclusive-OR gate 82 and the AND gate 86 of each bit other than the LSB. The output of the D flip-flop 60 is input to a preset terminal (when low is input, "1" is preset) of the D flop-flop 80 of each dummy bit. Thus, when the output of the D flip-flop 60 is low (the time constant is changed to a smaller value), the D flip-flops 80 of the dummy bits are all set high, namely, to "1" and an output of the AND gate 86 of the third dummy bit also goes high. Further, a low signal is supplied to one input terminal of the exclusive-OR gate 84 of each bit. Therefore, in each control bit, high Q output of the flip-flop 80 is transferred as a carry via the AND gate 86 and the exclusive-OR gate 82. In this state, output of the flip-flop 58 is supplied to the flip-flops 80 of the control bits as a clock, thus the control bits serve as a normal 2-bit up counter.

On the other hand, when the output of the D flip-flop 60 is high (the time constant is changed to a greater value), preset operation is not performed, thus all the flip-flops 80 perform normal operation. High signal is supplied to one input terminal of the exclusive-OR gate 84 of each bit. Therefore, for all bits, low Q output of the flip-flop 80 is transferred as a carry for setting the D flip-flop 80 low via high output of the exclusive-OR gate 84 and high output of the AND gate 86. In this state, output of the flip-flop 58 is supplied to the flip-flops 80 of the control bits as a clock, thus the control bits serve as a normal 2-bit down counter.

Figure 10:
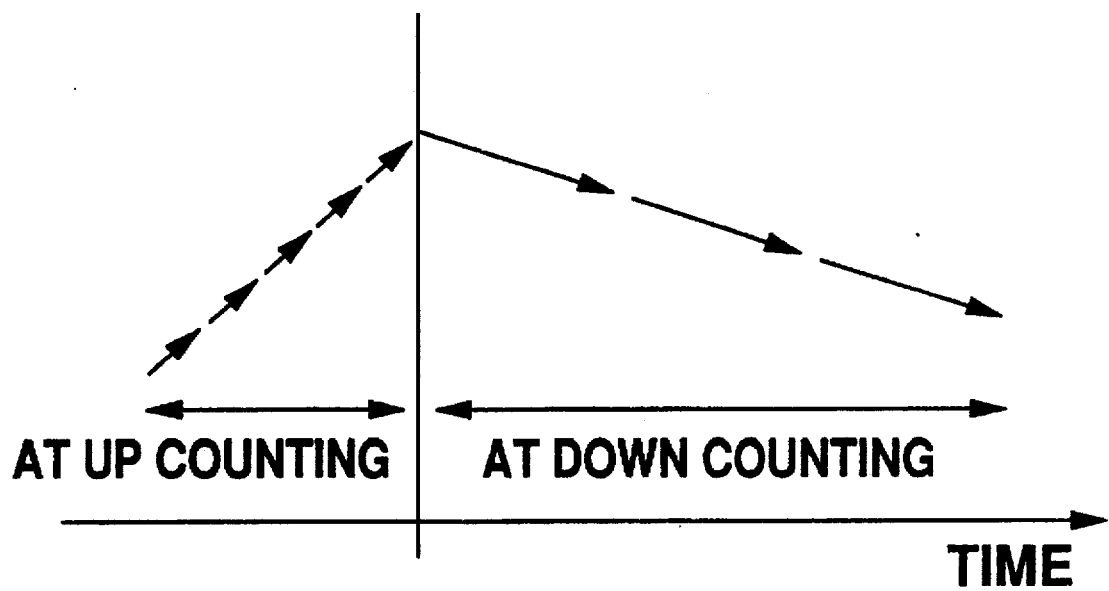
FIG. 10 is an illustration showing how a time constant changes in an embodiment of the present invention.

The count state is shown in FIG. 9. Thus, the time constant change circuit in the embodiment operates as a 2-bit counter at up counting and a 5-bit counter at down counting. Therefore, for example, if sound output becomes large from the silent state (attack), the time constant change circuit operates as a 2-bit up counter and outputs a signal for reducing the time constant upon output of the control bits set to "1" "1." In contrast, if sound output becomes small (recovery), it operates as a 5-bit down counter and outputs a signal for increasing the time constant upon output of the control bits set to "0" "0." Thus, the time constant changes rapidly for attack and gently for recovery, as shown in FIG. 10. In FIG. 9, under down count, only a part of the down counting is shown; i.e., the down count does not reach "00000." However, it is easily understood that "11111" is down counted to "00000" by subtracting one at a time.

Figure 11:
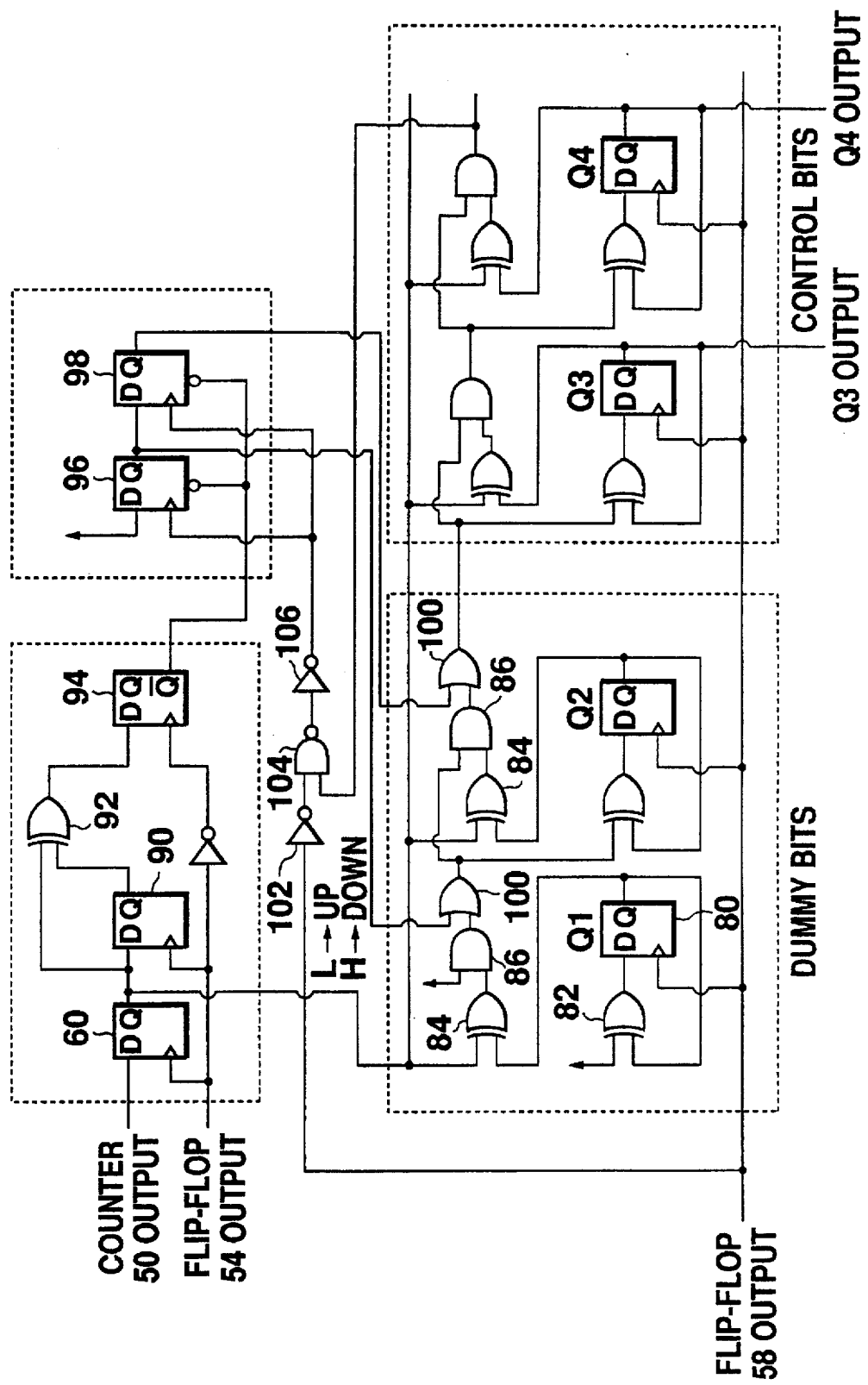
FIG. 11 is a block diagram showing the configuration of another example of the time constant controller of the present invention.

Further, FIG. 11 shows another configuration example of the time constant controller Including a 4-bit counter (Q1–Q4). In this example, an output of a D flip-flop 60 is input to another D flip-flop 90. Q output of the two D flip-flops 60 and 90 is input via an exclusive-OR gate 92 to another D flip-flop 94. The same clock is input to the D flip-flops 60 and 90. The same clock is inverted and supplied to the D flip-flop 94. If there is a high-to-low or low-to-high transition of the up or down Indicating signal, an input signal to the D flip-flop 60 results, outputs of the two D flip-flops 60 and 90 differ and the exclusive-OR gate 92 outputs high, which is then set in the D flip-flop 94. Therefore, the circuit can detect a change in up, down count for time constant control (an output change of the D flip-flop 60).

Inverted Q output of the D flip-flop 94 is inverted and supplied to reset terminals of D flip-flops 96 and 98. For this reason, the D flip-flops 96 and 98 are reset when the output state of the D flip-flop 94 changes.

On the other hand, the control bits have the same configuration as shown in FIG. 8, but two dummy bits rather than three are provided and for each dummy bit, an OR gate 100 is inserted in the output route of an AND gate 86 for transferring a carry. Q output of the D flip-flop 96 is input to another terminal of one OR gate 100 and that of the D flip-flop 98 to another terminal of the other OR gate 100. Therefore, if outputs of the D flip-flops 96 and 98 are high, the OR gates 100 output high regardless of the output state of the AND gate 86. Therefore, the two dummy bits can be deactivated by setting high in the D flip-flops 96 and 98.

A D input terminal of the D flip-flop 96 is pulled high and Q output of the D flip-flop 96 is input to a D input terminal of the D flip-flop 98. The same clock signal as the D flip-flop 80 is supplied to clock input terminals of the D flip-flops 96 and 98 via an inverter 102, a NAND gate 104, and an inverter 106. Output of the AND gate 86 of the MSB of the control bit is input to another input terminal of the NAND gate 104. Thus, when a carry out of the MSB of the control bit is high, the NAND gate 104 outputs low and the clock can be supplied to the D flip-flop. Therefore, when a carry is generated out of the MSB of the control bit, the D flip-flops 96 and 98 take in data.

When the counter thus functions as an up counter, if the control bits overflow from "1" "1," the D flip-flops 96 and 98 are set in order, whereby the dummy bits are decreased one at a time. Therefore, when up counting is continued by the circuit, the dummy bits are decreased in order. On the other hand, when the counter functions as a down counter, if the control bits overflow from "0" "0," the D flip-flops 96 and 98 are reset in order, whereby the dummy bits are increased one at a time. Therefore, when down counting is continued by the circuit, the dummy bits are increased in order.

Figure 13:
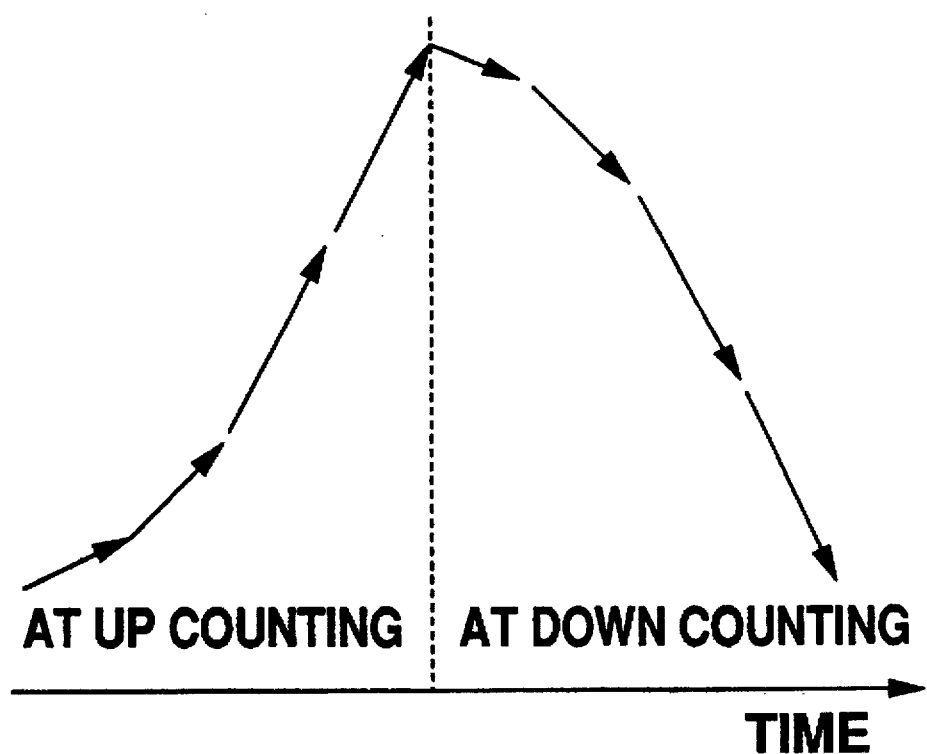
FIG. 13 is an illustration showing how a time constant changes of the present invention.

The counting state is shown in FIG. 12. For a time constant change for attack and for recovery, a response accelerates gradually, as shown in FIG. 13. Therefore, when the same state continues, a response can be accelerated gradually and a sense of acoustic disorder can be decreased.

What is claimed is:

1. An A/D converter having characteristics that can be changed, said A/D converter comprising:

a quantizer for quantizing an intermediate analog signal for outputting a pulse string signal;

a variable integrator for integrating the output of said quantizer with any desired time constant;

an adder for adding an input analog signal and an output of said variable integrator and supplying a result of the addition to said quantizer as the intermediate analog signal;

change direction detection means for detecting a direction of change in the input analog signal, said change direction detection means detecting a change in which the input analog signal becomes large versus a change in which the input analog signal becomes small; and time constant control means for controlling the time constant of said variable integrator in response to an output signal from said change direction detection means, wherein the time constant control means operates such that the time constant changes at a first speed when the input analog signal becomes large and the time constant changes at a second speed, which is slower than the first speed, when the input analog signal becomes small.

2. The A/D converter as defined in claim 1, wherein said change direction detection means detects a period of attack versus a period of recovery, and said time constant control means operates such that the time constant changes promptly during a period of attack and changes gradually during a period of recovery.

3. An A/D converter having characteristics that can be changed, said A/D converter comprising:

a quantizer for quantizing an intermediate analog signal for outputting a pulse string signal;

a variable integrator for integrating the output of said quantizer with any desired time constant;

an adder for adding an input analog signal and an output of said variable integrator and supplying a result of the addition to said quantizer as the intermediate analog signal;

change direction detection means for detecting a direction of change in the input analog signal, said change direction detection means detecting a change in which the input analog signal becomes large versus a change in which the input analog signal becomes small, said change direction detection means including:

a counter for counting a high or low duration of the pulse string signal output by said quantizer for a predetermined time; and decode means responsive to whether or not a value of said counter is a predetermined value for outputting a high or low signal, whereby a large or small change in the input analog signal is detected in response to whether said decode means outputs a high or low signal; and time constant control means for controlling the time constant of said variable integrator in response to an output signal from said change direction detection means so that the time constant changes at a first speed when the input analog signal becomes large and the time constant changes at a second speed, which is slower than the first speed, when the input analog signal becomes small.

4. An A/D converter having characteristics that can be changed, said A/D converter comprising:

a quantizer for quantizing an intermediate analog signal for outputting a pulse string signal;

a variable integrator for integrating the output of said quantizer with any desired time constant;

an adder for adding an input analog signal and an output of said variable integrator and supplying a result of the addition to said quantizer as the intermediate analog signal;

change direction detection means for detecting a direction of change in the input analog signal, said change direction detection means detecting a change in which the input analog signal becomes large versus a change in which the input analog signal becomes small; and time constant control means for controlling the time constant of said variable integrator in response to an output signal from said change direction detection means so that the time constant changes at a first speed when the input analog signal becomes large and the time constant changes at a second speed, which is slower than the first speed, when the input analog signal becomes small, said time constant control means including:
  an up/down counter which serves as an up or down counter in response to the direction, in which a change becomes large or small, output by said change direction detection means,
  wherein said up/down counter uses a first number of bits at up counting and a second number of bits, which is different from the first number of bits, at down counting, thereby outputting a different signal depending on the direction in which a change becomes large or small, for changing the time constant based on the outputted signal.

5. The A/D converter as defined in claim 4, wherein said up/down counter has at least one dummy bit and uses the dummy bit for counting only either at up counting or at down counting for changing the number of bits.

6. An A/D converter having characteristics that can be changed, said A/D converter comprising:
  a quantizer for quantizing an intermediate analog signal for outputting a pulse string signal;
  a variable integrator for integrating the output of said quantizer with any desired time constant;
  an adder for adding an input analog signal and an output of said variable integrator and supplying a result of the addition to said quantizer as the intermediate analog signal;
  change direction detection means for detecting a detection of change in the input analog signal, said change direction detection means detecting a change in which the input analog signal becomes large versus a change in which the input analog signal becomes small; and
  time constant control means for controlling the time constant of said variable integrator in response to an output signal from said change direction detection means so that the time constant changes at a first speed when the input analog signal becomes large and the time constant changes at a second speed, which is slower than the first speed, when the input analog signal becomes small,
  wherein said time constant control means operates so that the time constant change speed accelerates in sequence if the same change direction continues.

7. An A/D converter having characteristics that can be changed, said A/D converter comprising:
  a quantizer for quantizing an intermediate analog signal for outputting a pulse string signal;
  a variable integrator for integrating the output of said quantizer with any desired time constant;
  an adder for adding an input analog signal and an output of said variable integrator and supplying a result of the addition to said quantizer as the intermediate analog signal;
  change direction detection means for detecting a direction of change in the input analog signal, said change direction detection means detecting a change in which the input analog signal becomes large versus a change in which the input analog signal becomes small; and
  time constant control means for controlling the time constant of said variable integrator in response to an output signal from said change direction detection means so that the time constant changes at a first speed when the input analog signal becomes large and the time constant changes at a second speed, which is slower than the first speed, when the input analog signal becomes small, said time constant control means including:
  an up/down counter which serves as an up or down counter in response to the direction, in which a change becomes large or small, output by said change direction detection means, said up/down counter being able to use different numbers of bits for counting,
  wherein the number of bits used by said up/down counter is changed in sequence both at up counting and at down counting and is increased in sequence at either up counting or down counting and is decreased in sequence at the other counting, thereby outputting a signal which varies and changes in response speed in sequence depending on the direction in which a change becomes large or small, for changing the time constant based on the outputted signal.

8. The A/D converter as defined in claim 7, wherein said up/down counter has at least two dummy bits and changes the number of dummy bits used for counting at up counting and at down counting in sequence.

9. An A/D converter having characteristics that can be changed, said A/D converter comprising:
  a quantizer for quantizing an intermediate analog signal and outputting a pulse string signal;
  a variable integrator for integrating the output of said quantizer with any desired time constant;
  an adder for adding an input analog signal and an output of said variable integrator and supplying a result of the addition to said quantizer as the intermediate analog signal;
  change direction detection means for detecting a direction of change in the input analog signal, said change direction detection means detecting whether a change rate of the input analog signal becomes large or the change rate of the input analog signal becomes small; and
  time constant control means for controlling the time constant of said variable integrator in response to an output signal from said change direction detection means,
  wherein the time constant control means operates such that the time constant changes at a first speed when the change rate of the input analog signal becomes large and the time constant changes at a second speed, which is slower than the first speed, when the change rate of the input analog signal becomes small.

10. The A/D converter as defined in claim 9, wherein said change direction detection means includes:
  a counter for counting a high or low duration of the pulse string signal output by said quantizer for a predetermined time; and
  decode means responsive to whether or not a value of said counter is a predetermined value for outputting a high or low signal,
  wherein a large or small change rate of the input analog signal is detected in response to whether said decode means outputs a high or low signal.

11. The A/D converter as defined in claim 9, wherein said time constant control means includes:
  an up/down counter which serves as an up or down counter in response to the direction, in which the change rate of the input analog signal becomes large or small, output by said change direction detection means,
  wherein said up/down counter uses a first number of bits at up counting and a second number of bits, which is different from the first number of bits, at down counting in order to output a different signal depending on the direction in which the change rate becomes large or small, the signal output from said up/down counter being used for changing the time constant of said variable integrator.

12. The A/D converter as defined in claim 11, wherein said up/down counter has at least one dummy bit and uses the dummy bit for counting only either at up counting or at down counting for changing the number of bits.

13. The A/D converter as defined in claim 9, wherein said time constant control means operates so that the time constant change speed accelerates in sequence if the same change direction continues.

14. The A/D converter as defined in claim 9, wherein said time constant control means includes:
   an up/down counter which serves as an up or down counter in response to the direction, in which the change rate of the input analog signal becomes large or small, output by said change direction detection means, said up/down counter being able to use different numbers of bits for counting,
   wherein the number of bits used by said up/down counter is changed in sequence both at up counting and at down counting and is increased in sequence at either up counting or down counting and is decreased in sequence at the other counting in order to output a signal which varies and changes in response speed in sequence depending on the direction in which the change rate becomes large or small, the signal output from said up/down counter being used for changing the time constant of said variable integrator.

15. The A/D converter as defined in claim 14, wherein said up/down counter has at least two dummy bits and changes the number of dummy bits used for counting at up counting and at down counting in sequence.

16. The A/D converter as defined in claim 9,
   wherein said change direction detection means detects a period of attack versus a period of recovery, and
   said time constant control means operates such that the time constant changes promptly during a period of attack and changes gradually during a period of recovery.

* * * * *